United States Patent [19]

Arai et al.

[11] Patent Number: 5,026,741

[45] Date of Patent: Jun. 25, 1991

[54] PHOTOCURABLE ORGANOPOLYSILOXANE COMPOSITION

[75] Inventors: Masatoshi Arai; Kazutoshi Fujioka, both of Annaka; Masaharu Satou, Takasaki, all of Japan

[73] Assignee: Shin-Etsu Chemical Co., Ltd., Japan

[21] Appl. No.: 357,850

[22] Filed: May 30, 1989

[30] Foreign Application Priority Data

May 30, 1988 [JP] Japan ................ 63-132354

[51] Int. Cl.$^5$ ............... C08G 77/20; C08G 77/24
[52] U.S. Cl. ................... 522/33; 522/99; 522/172; 528/32; 528/41; 528/42; 528/36
[58] Field of Search ............ 522/99, 33, 172

[56] References Cited

U.S. PATENT DOCUMENTS

| | | | |
|---|---|---|---|
| 4,064,027 | 12/1977 | Gant | 204/159.13 |
| 4,151,319 | 4/1979 | Sackoff et al. | 428/40 |
| 4,675,346 | 6/1987 | Lin et al. | 522/99 |

FOREIGN PATENT DOCUMENTS

| | | |
|---|---|---|
| 0276986 | 8/1988 | European Pat. Off. . |
| 60-104158 | 6/1985 | Japan . |
| 62-15454 | 1/1987 | Japan . |
| 0183911 | 7/1988 | Japan . |
| 1323869 | 7/1973 | United Kingdom . |

Primary Examiner—Marion E. McCamish
Assistant Examiner—Susan Berman
Attorney, Agent, or Firm—Lowe, Price, LeBlanc & Becker

[57] ABSTRACT

A photocurable organopolysiloxane composition comprising an organopolysiloxane having at least one photocurable acryloxyorganosilyl group in the molecule, a polyether-modified organopolysiloxane and a photoinitiator. The composition has good peelable protective properties after curing and heating, for example, in hot solder bath.

15 Claims, No Drawings

PHOTOCURABLE ORGANOPOLYSILOXANE COMPOSITION

BACKGROUND OF THE INVENTION

1. Field of the Invention

This invention relates to photocurable organopolysiloxane compositions which are able to cure by application of actinic light, particularly UV light, to provide rubber elastomers which have good peelable protective properties during and after heating which will be hereinafter called peelability after heating. The composition is particularly useful as a masking material for printed wiring boards or temporary adhesives for precision parts. It will be noted that the term "peelability after heating" is intended to mean peelability of the composition from other materials after heating, for example, in a solder bath.

2. Description of the Prior Art

It is well known that organopolysiloxanes heated in the presence of organic peroxides provide silicone rubber elastomers which have good heat and cold resistances, weatherability and electric characteristics. It is also known that certain types of organosiloxanes are cured by irradiation of light in the presence of a photo-initiator.

For instance, Japanese Patent Publication No. 52-40334 (corresponding to U.S. Pat. No. 4,064,027) and Japanese Laid-open Patent Application No. 60-104158 describe photocurable organopolysiloxane compositions wherein vinyl group-containing polysiloxanes and mercapto group-containing polysiloxanes are cured through photo-radical addition reaction. However, the use of the mercapto group-containing polysiloxanes involves the problem of offensive odor and metal corrosion, thus placing a limit on the application of the compositions.

Japanese Patent Publication No. 53-36515 (corresponding to Great Britain Patent Specification No. 1323869) and Japanese Laid-open Patent Application No. 60-215009 (corresponding to U.S. Pat. No. 4,675,346) propose photocurable compositions which are comprised of acryl group-containing polysiloxanes and sensitizers therefor. For obtaining rubbery elastomers from these compositions, use of linear polymers with a high molecular weight is necessary. This leads to a relative reduction in amount of acryl groups provided at terminal ends of the polysiloxane, so that curability becomes poor. In addition, the composition undergoes little curing at the surface portion exposed to air because of the impediment of the curing with oxygen. To avoid this, polysiloxanes having a relatively large quantity of acryl groups are actually used. Such a composition undesirably provides a resin rather a rubbery elastomer.

We have already proposed in Japanese Patent Application No. 62-15414 a photocurable composition which comprises a novel acryloxyalkylsilanol compound, a linear polysiloxane wherein a plurality of acryl groups are introduced at terminal ends of the linear polymer, and a sensitizer. This composition provides a silicone rubber elastomer but the elastomer does not have a good peelability-after-heating property.

SUMMARY OF THE INVENTION

It is accordingly an object of the invention to provide a photocurable organopolysiloxane composition which is capable of yielding a rubbery elastomer by application of actinic light, which elastomer has unexpectedly good heat resistance and good peelability after heating.

It is another object of the invention to provide a photocurable organopolysiloxane composition which is particularly suitable for use as a masking material for precision parts when photocured.

The photocurable composition according to the invention comprises:

100 parts by weight of an organopolysiloxane having at least one group of the following general formula (1) in one molecule

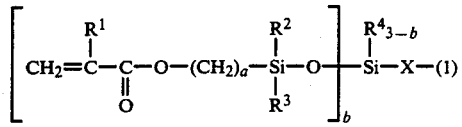

wherein $R^1$ represents a hydrogen atom or a methyl group, $R^2$, $R^3$ and $R^4$ independently represent an unsubstituted or substituted monovalent hydrocarbon group, X represents an oxygen atom or an ethylene group, and a and b are independently an integer of 1 to 3;

from 0.1 to 20 parts by weight of a polyether-modified organopolysiloxane of the following general formula (2)

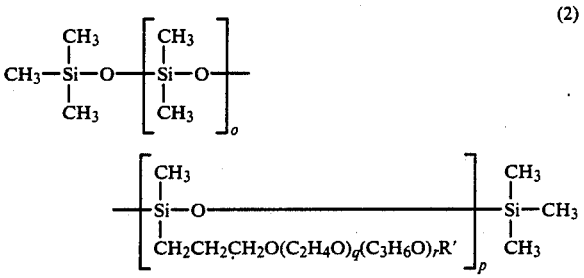

wherein R' represents an unsubstituted or substituted monovalent hydrocarbon group, and o, p, q and r are independently an integer defined such that $0 \leq o \leq 50$, $1 \leq p \leq 50$, $1 \leq q \leq 100$ and $0 \leq r \leq 100$; and from 0.01 to 10 parts by weight of a photo-initiator.

We found that when the polyether-modified organopolysiloxane of the formula (2) is added to a composition comprised of the organopolysiloxane having the acryloxyorganosilyl group of the formula (1) and the photo-initiator therefor, the resultant composition is able to yield a rubber elastomer by irradiation of UV light. The rubber elastomer was unexpectedly found to have good peelability after heating and a wide utility particularly in the field of masking.

DETAILED DESCRIPTION AND EMBODIMENTS OF THE INVENTION

The first ingredient used in the composition of the invention is an organopolysiloxane having at least one acryloxyorganosilyl group of the following formula (1) in the molecule In the above formula, $R^1$ is a hydrogen atom or a methyl group, $R^2$, $R^3$ and $R^4$ independently represent a monovalent hydrocarbon group which may be either unsubstituted or substituted. Examples of the monovalent hydrocarbon group include a lower alkyl group such as a methyl group, an ethyl group, a propyl group, a butyl group or the like, a cycloalkyl group such as a cyclohexyl group, an alkenyl group such as a vinyl group, an allyl group or the like, an aryl group such as a phenyl group, a tolyl group or the like. These groups may be substituted with a halogen atom or a cyano group at all or part of the hydrogen atoms joined to the carbon atoms of the groups. Specific examples of the substituted groups include a chloromethyl group, a trifluoropropyl group, a cyanoethyl group and the like. Moreover, X in the formula (1) is an oxygen atom or an ethylene group, and a and b are independently an integer of from 1 to 3.

In the above formula (1), it is preferred that $R^1$ is a hydrogen atom, $R^2$, $R^3$ and $R^4$ are independently a methyl group, a phenyl group or a 3,3,3-trifluoropropyl group, X is an ethylene group, a is 1 or 3, and b is 2 or 4.

It is also preferred that the first ingredient is a substantially linear diorganopolysiloxane having the group of the formula (1) at both ends of the molecular chain. More preferably, the first ingredient is an organopolysiloxane of the following general formula

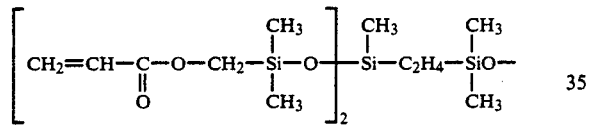

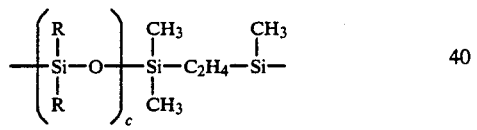

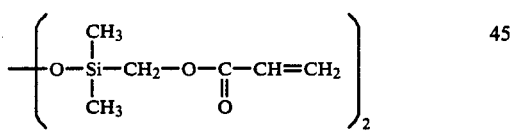

wherein each R represents a methyl group, a phenyl group or a 3,3,3-trifluoropropyl group, and c is zero or an integer larger than 1, inclusive.

Specific examples of the organopolysiloxane useful in the present invention are indicated below.

(a)

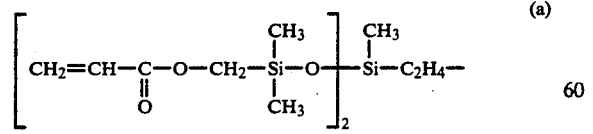

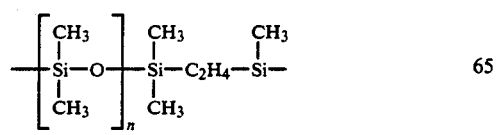

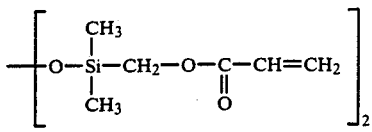

(b)

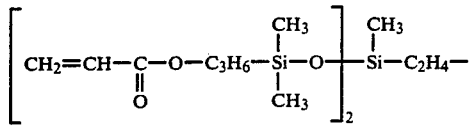

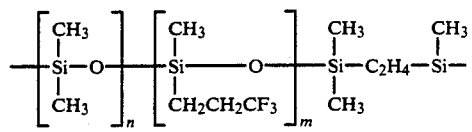

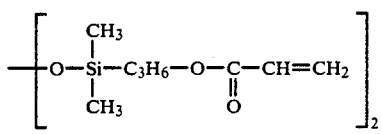

(c)

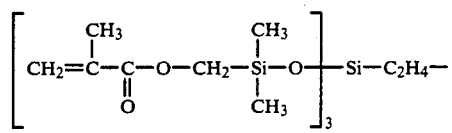

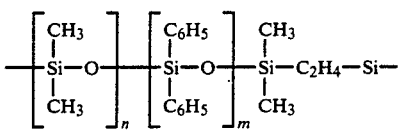

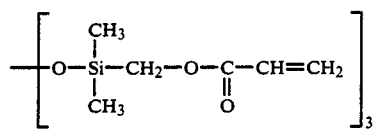

(d)

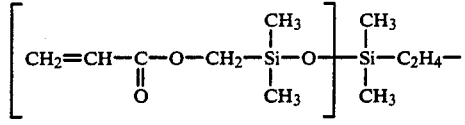

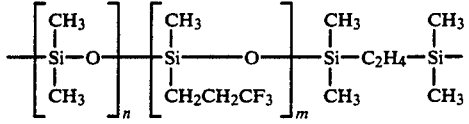

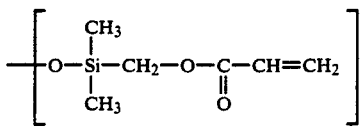

(e)

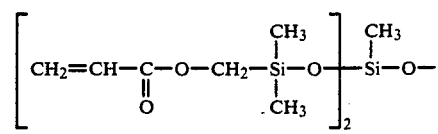

-continued

Specific but not limitative examples of the polyether-modified organopolysiloxane are indicated below.

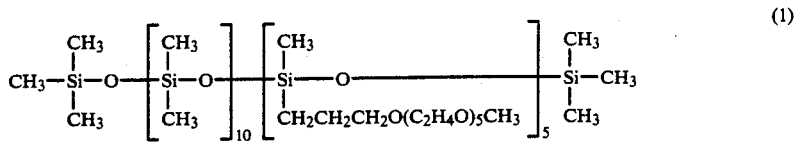

(1)

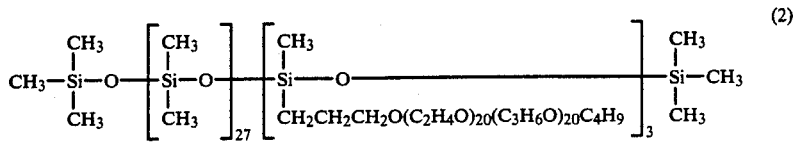

(2)

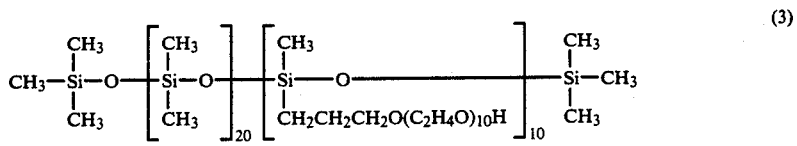

(3)

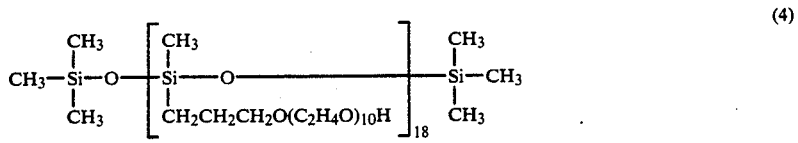

(4)

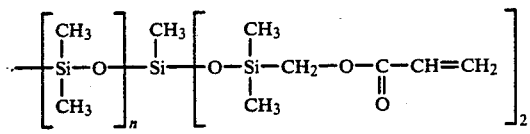

(f)

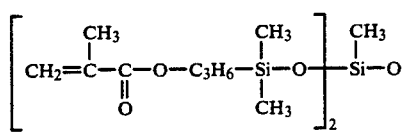

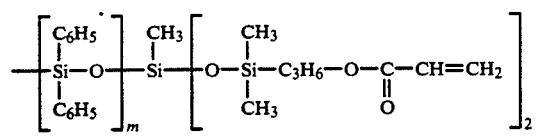

In the above formulae (a) to (f), each n and each m are independently zero or an integer of 1 or over provided that $m+n \geq 1$. Preferably, $1 \leq m+n \leq 2000$.

The second ingredient of the composition of the invention is a polyether-modified organopolysiloxane which is added so as to impart peelability immediately after curing of the first organopolysiloxane ingredient. The second ingredient is of the following general formula

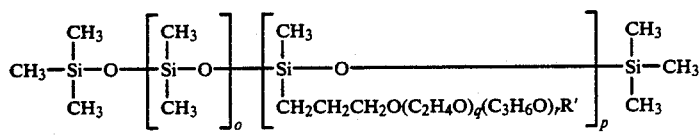

wherein R' represents a hydrogen atom or an unsubstituted or substituted monovalent hydrocarbon group, $0 \leq o \leq 50$, $1 \leq p \leq 50$, $1 \leq q \leq 100$ and $0 \leq r \leq 100$. If R' represents an unsubstituted or substituted monovalent hydrocarbon group, this group may be the same as defined with respect to the general formula (1). R' is preferably a hydrogen atom or a lower alkyl group.

The amount of the second ingredient is in the range of from 0.1 to 20 parts by weight per 100 parts by weight of the first ingredient. If the amount is less than 0.1 part by weight, the resultant silicone rubber may become poor in heat peel resistance. Over 20 parts by weight, the composition is adversely influenced with respect to its curing. Preferably, the amount is in the range of from 1.0 to 10 parts by weight per 100 parts by weight of the first ingredient.

The photo-initiator which is used as a third ingredient is used to promote photo-polymerization of the acryl groups in the organopolysiloxane used as the first ingredient. This initiator may be any one which is known in the art. Examples of such an initiator include acetophenone, propiophenone, benzophenone, xanthone, fluorene, benzaldehyde, anthraquinone, triphenylamine, carbazole, 3-methylacetophenone, 4-methylacetophenone, 3-pentylacetophenone, 4-methoxyacetophenone, 3-bromoacetophenone, 4-allylacetophenone, p-diacetylbenzene, 3-methoxybenzophenone, 4-methylbenzophenone, 4-chlorobenzophenone, 4,4'-dimethoxybenzophenone, 4-chloro-4'-benzoylbenzophenone, 3-chloroxanthone, 3,9-dichloroxanthone, 3-chloro-8-nonylxanthone, benzoin, benzoin methyl ether, benzoin butyl ether, bis(4-dimethylaminophenyl)ketone, benzyl methoxyketal, 2-chlorothioxanthone, diethylacetophenone, 1-hydroxycyclohexyl phenyl ketone, 2-methyl[4-(methylthio)phenyl]-2-morpholino-1-propanone, 2,2-dimethoxy-2-phenylacetophenone and the like. The amount of the third ingredient is in the range of from 0.01 to 10 parts by weight per 100 parts by weight of the first ingredient. If the amount is less than 0.01 part by weight, little effect of the addition is expected. On the other hand, when the amount is over 10 parts by weight, the resultant silicone rubber obtained after curing has relatively poor physical properties.

The composition of the invention is obtained by uniformly mixing the first to third ingredients. In order to improve mechanical properties of the silicone rubber obtained from the composition, fillers such as fumed silica may be added in amounts not impeding the photo-curing reaction. In addition, thixotropic agents, heat-resistance improvers and colorants may be added in order to impart controlled properties to the final silicone rubber.

The composition of the invention is readily cured within a short time of from 1 to 20 seconds by irradiation of UV light. This is because the organopolysiloxane used as the first ingredient contains photo-curable acryloxyorganosilyl groups. The cured elastomer is non-corrosive and odorless. Moreover, the addition of the second ingredient imparts a good peelability-after-heating property to the cured elastomer. Thus, the cured elastomer is particularly useful as a masking material for printed wiring boards.

The present invention is more particularly described by way of examples. A synthetic example for the first organopolysiloxane ingredient and comparative examples are also shown. In these examples, parts are by weight and measurements of viscosity, specific density and refractive index are those determined at 25° C.

SYNTHETIC EXAMPLE 1,000 g of α,ω-divinyldimethylpolysiloxane or the following formula having a viscosity of 600 centistokes CH$_2$=CH—Si(CH$_3$)$_2$—O—[Si(CH$_3$)$_2$—O]$_{200}$—[Si(C$_6$H$_5$)$_2$—O]$_{22}$—Si(CH$_3$)$_2$—CH=CH$_2$ The contents were heated at 120° C. for 2 hours in a stream of nitrogen gas, followed by removal of water and cooling. Thereafter, 0.1 g of a solution of chloroplatinic acid in isopropyl alcohol (platinum content: 2 wt %) and 12 g of methyldichlorosilane were added to the contents, followed by reaction at 90° C. and passage of a nitrogen gas into the solution at the same temperature while reducing the pressure in the flask by means of an aspirator, thereby removing unreacted methyldichlorosilane outside the reaction system.

Subsequently, 22 g of triethylamine and 3 g of 2,6-di-t-butyl-4-methylphenol were added, in which 32 g of α-acryloxymethyldimethylsilanol was dropped in 20 minutes, followed by reaction at 60° C. for 2 hours. Thereafter, 500 g of toluene was added to the reaction system and the resultant salt was removed by filtration, followed by removal of the toluene and excess triethylamine under reduced pressure to obtain 910 g of a colorless transparent oil (hereinafter referred to simply as polysiloxane I). The IR and NMR analyses of the product revealed that the product was a polymer of the following formula

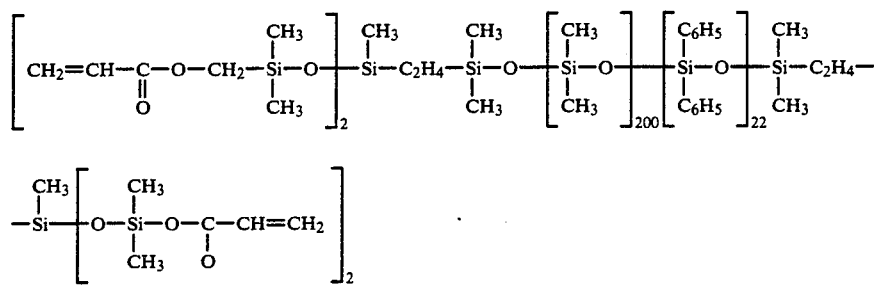

The polymer had the following physical properties:
Viscosity: 32 poises
Specific density: 1.026
Refractive index: 1.4510

EXAMPLE 1, COMPARATIVE EXAMPLE 1

To the polysiloxane I obtained in the Synthetic Example were added a polyether-modified polysiloxane of the following formula (hereinafter referred to simply as modified polysiloxane I), 1-hydroxycyclohexyl phenyl ketone used as a photo-initiator and fumed silica (hereinafter referred to simply as silica I) used as a reinforcing filler which had been subjected to hydrophobic treatment with hexamethyldisilazane and had a specific surface area of 200 m$^2$/g in amounts indicated in Table 1, respectively,

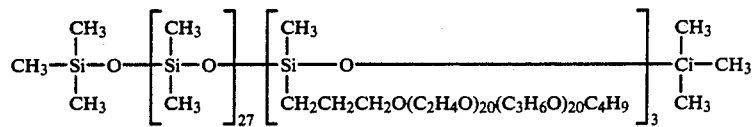

The mixture was uniformly kneaded to obtain siloxane composition I. For comparison, the above procedure was repeated except that modified polysiloxane I was not added, thereby obtaining siloxane composition II.

The siloxane compositions I and II were each formed into a sheet having a size of 120×120×2 mm. Each sheet was irradiated three times with UV light from a UV irradiator, ASE-20 (Nippon Battery Co., Ltd.) at a moving speed of 1 m/minute at a distance of 10 cm from the UV irradiator and thus cured to obtain a rubber elastomer. These elastomers were subjected to measurement of physical properties according to the method prescribed in JIS K-6301 (Physical Experiment for Vulcanized Rubber). Moreover, the compositions I and II were cured on a printed board in a thickness of 0.1 mm and immersed in a solder bath at 260° C. for certain times. After removal from the solder bath, the peelability from the printed board was checked in a manner where the composition layer was peeled at an angle of 90° with respect to the printed board. These results are shown in Table 1 below.

TABLE 1

| Composition No. | Example 1<br>I | Comp. Ex. 1<br>II |
|---|---|---|
| Compositions (Parts) | | |
| polysiloxane I | 100 | 100 |
| modified polysiloxane I | 1.0 | |
| photo-initiator | 3.0 | 3.0 |
| silica I | 12.0 | 12.0 |
| Physical Properties of Cured Elastomer: | | |
| hardness (JIS A) | 40 | 37 |
| tensile strength (kgf/cm²) | 140 | 150 |
| elongation (%) | 18 | 15 |
| Peelability After Heating In Solder Bath: | | |
| 60 seconds | peeled | not peeled |
| 120 seconds | peeled | not peeled |

EXAMPLES 2 TO 3 AND COMPARATIVE EXAMPLE 2

Modified polysiloxane I used in Example 1 was added to 100 parts of the polysiloxane I in amounts indicated in Table 2, to which 3 parts of 1-hydroxycyclohexyl phenyl ketone used as a photo-initiator and 12.0 parts of silica I were added, followed by uniform kneading to obtain compositions III and IV. For comparison, the above procedure was repeated except that the modified polysiloxane I was not added, thereby obtaining siloxane composition II as used in Example 1. The siloxane compositions II to IV were treated in the same manner as in Example 1 and the resultant rubber elastomers were subjected to measurements of the physical properties and the the solder heat peel resistance. The results are shown in Table 2.

TABLE 2

| | Example | | Comp.<br>Ex. 2 |
|---|---|---|---|
| Composition No. | 2<br>III | 3<br>IV | II |
| Compositions (Parts) | | | |
| polysiloxane I | 100 | 100 | 100 |
| modified polysiloxane I | 5.0 | 10 | |
| photo-initiator | 3.0 | 3.0 | 3.0 |
| silica I | 12.0 | 12.0 | 12.0 |
| Physical Properties of Cured Elastomer: | | | |
| hardness (JIS A) | 39 | 37 | 37 |
| tensile strength (kgf/cm²) | 130 | 130 | 150 |
| elongation (%) | 17 | 15 | 15 |
| Peelability After Heating in Solder Bath: | | | |
| 60 seconds | peeled | peeled | not peeled |
| 120 seconds | peeled | peeled | not peeled |

EXAMPLE 4 TO 7 AND COMPARATIVE EXAMPLE 3

To 100 parts of the polysiloxane I were added the modified polysiloxane I used in Examples 1 to 3 or modified polysiloxanes II, III and IV of the following formulae in amounts indicated in Table 3 along with 3 parts of 1-hydroxycyclohexyl phenyl ketone and 12.0 parts of silica I.

Modified polysiloxane II

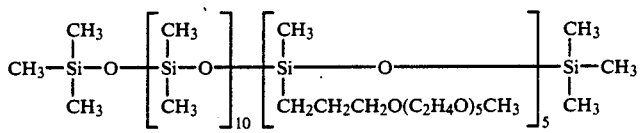

Modified polysiloxane III

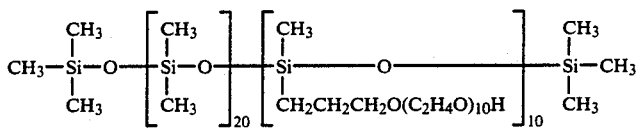

Modified polysiloxane IV

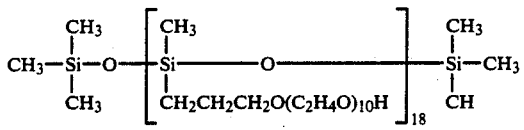

The mixtures were each uniformly kneaded to obtain siloxane compositions V to VIII. For comparison, the above procedure was repeated except that the modified polysiloxanes I to IV were not added at all, thereby obtaining siloxane composition II. The siloxane compositions V to VIII and II were treated in the same manner as in Example 1 and the resultant rubber elastomers were subjected to measurements of the physical properties and the peelability in the same manner as in the foregoing examples. The results are shown in Table 3.

TABLE 3

| | Example | | | | Comp. Ex. |
|---|---|---|---|---|---|
| | 4 | 5 | 6 | 7 | 3 |
| Composition No. | V | VI | VII | VIII | II |
| Compositions (Parts) | | | | | |

TABLE 3-continued

|  | Example | | | | Comp. Ex. |
| --- | --- | --- | --- | --- | --- |
|  | 4 | 5 | 6 | 7 | 3 |
| Composition No. | V | VI | VII | VIII | II |
| polysiloxane I | 100 | 100 | 100 | 100 | 100 |
| modified polysiloxane I |  |  |  |  |  |
| I | 1.0 |  |  |  |  |
| II |  | 1.0 |  |  |  |
| III |  |  | 1.0 |  |  |
| IV |  |  |  | 1.0 |  |
| photo-initiator | 3.0 | 3.0 | 3.0 | 3.0 | 3.0 |
| silica I | 12.0 | 12.0 | 12.0 | 12.0 | 12.0 |
| Physical Properties of Cured Elastomer: |  |  |  |  |  |
| hardness (JIS A) | 40 | 38 | 39 | 41 | 37 |
| tensile strength (kg/cm²) | 140 | 150 | 140 | 130 | 150 |
| elongation (%) | 18 | 16 | 18 | 19 | 15 |
| Peelability After Heating In Solder Bath: |  |  |  |  |  |
| 60 seconds | peeled | peeled | peeled | peeled | not peeled |
| 120 seconds | peeled | peeled | peeled | peeled | not peeled |

What is claimed is:

1. A photocurable organopolysiloxane composition comprises:

100 parts by weight of an organopolysiloxane having at least one group of the following general formula (1) in one molecule

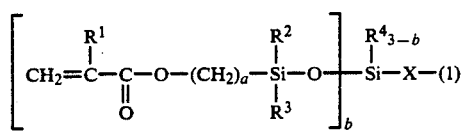

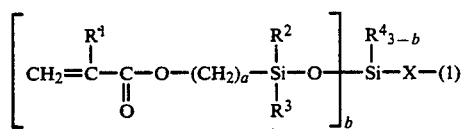

wherein $R^1$ represents a hydrogen atom or a methyl group, $R^2$, $R^3$ and $R^4$ independently represent an unsubstituted or substituted monovalent hydrocarbon group, X represents an ethylene group, and a and b are independently an integer of 1 to 3;

from 0.1 to 20 parts by weight of a polyether-modified organopolysiloxane of the following general formula (2)

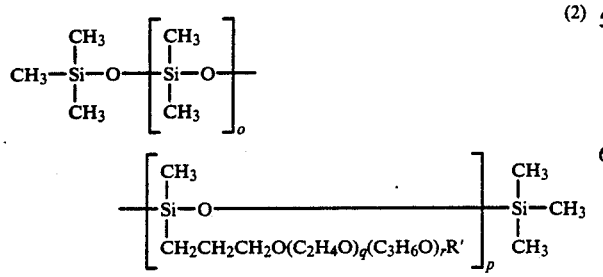

wherein $R^1$ represents a hydrogen atom or an unsubstituted or substituted monovalent hydrocarbon group, and o, p, q and r are independently an integer defined such that $0 \leq o \leq 50$, $1 \leq p \leq 50$, $1 \leq q \leq 100$ and $0 \leq r \leq 100$; and from 0.01 to 10 parts by weight of a photo-initiator.

2. The composition according to claim 1, wherein said organopolysiloxane having at least one group of the general formula (1) is a substantially linear diorganopolysiloxane having the group of the general formula (1) at both ends of the molecular chain.

3. The composition according to claim 1, wherein in the formula (1), $R^1$ represents a hydrogen atom, $R^2$, $R^3$ and $R^4$ in the formula (1) are independently a methyl group, a phenyl group, or a 3,3,3-trifluoropropyl group, X represents an ethylene group, a is 1 or 3, and b is 2 or 3.

4. The composition according to claim 1, wherein said organopolysiloxane having at least one group of the general formula (1) is of the following general formula

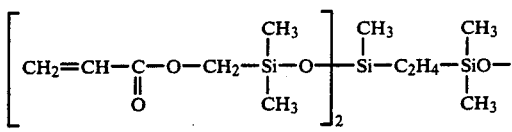

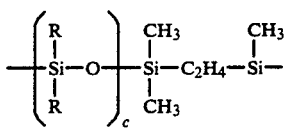

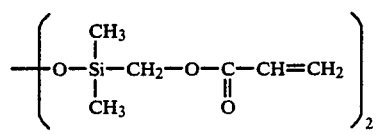

wherein each R represents a methyl group, a phenyl group or a 3,3,3,-trifluoropropyl group, and c is zero or an integer of 1 or over.

5. The composition according to claim 1, wherein said organopolysiloxane having at least one group of the general formula (1) is a compound of the following formula

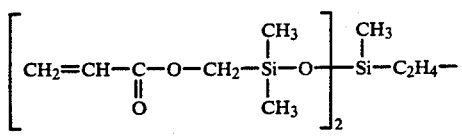

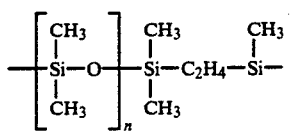

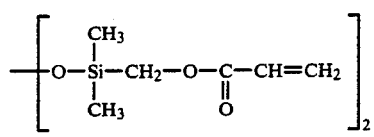

wherein n is an integer of 1 or over.

6. The composition according to claim 1, wherein said organopolysiloxane having at least one group of the general formula (1) is a compound of the following formula

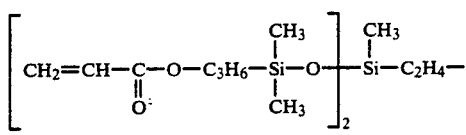

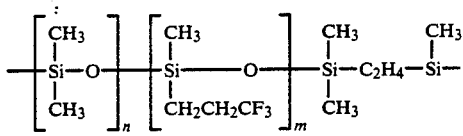

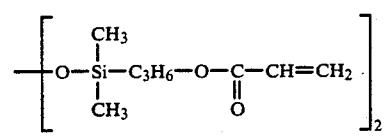

wherein m and n are independently zero or an integer of 1 or over provided that $m+n \geq 1$.

7. The composition according to claim 1, wherein said organopolysiloxane having at least one group of the general formula (1) is a compound of the following formula

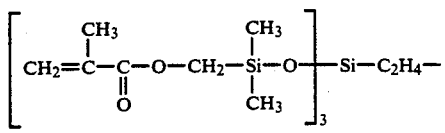

wherein n and m are independently zero or an integer of 1 or over provided that $m+n \geq 1$.

8. The composition according to claim 1, wherein said organopolysiloxane having at least one group of the general formula (1) is a compound of the following formula

[formulas as shown]

wherein n and m are independently zero or an integer of 1 or over provided that $m+n \geq 1$.

9. The composition according to claim 1, wherein in the formula (2), R' represents a hydrogen atom or a lower alkyl group.

10. The composition according to claim 1 wherein said polyether-modified organopolysiloxane is used in an amount of from 1.0 to 10 parts by weight.

11. The composition according to claim 1, wherein said polyether-modified organopolysiloxane is a compound of the following formula

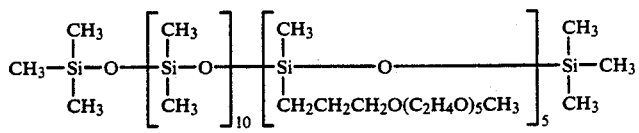

12. The composition according to claim 1, wherein said polyether-modified organopolysiloxane is a compound of the following formula

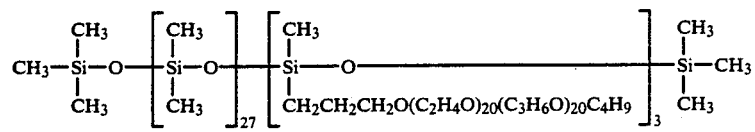
13. The composition according to claim 1, wherein said polyether-modified organopolysiloxane is a compound of the following formula
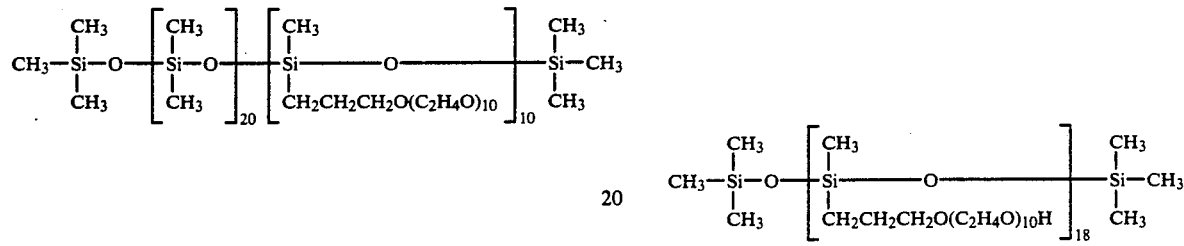
14. The composition according to claim 1, wherein said polyether-modified organopolysiloxane is a compound of the following formula
15. A cured product obtained from the composition of claim 1.
* * * * *